(12) United States Patent
Kim et al.

(10) Patent No.: US 8,227,816 B2
(45) Date of Patent: Jul. 24, 2012

(54) ORGANIC LIGHT EMITTING DISPLAY DEVICE

(75) Inventors: Sung-ho Kim, Suwon-si (KR); Ju-won Yoon, Suwon-si (KR); Su-Mi Lee, Suwon-si (KR); Il-Jeong Lee, Suwon-si (KR); Kwan-Hee Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 259 days.

(21) Appl. No.: 12/694,517

(22) Filed: Jan. 27, 2010

(65) Prior Publication Data

US 2010/0193794 A1 Aug. 5, 2010

(30) Foreign Application Priority Data

Jan. 30, 2009 (KR) .................. 10-2009-0007384

(51) Int. Cl.
*H01J 1/62* (2006.01)
*H01L 33/00* (2010.01)

(52) U.S. Cl. .................. 257/89; 257/E33.064; 313/505; 313/506

(58) Field of Classification Search .............. 257/89, 257/E33.064; 313/505, 506
See application file for complete search history.

(56) References Cited

U.S. PATENT DOCUMENTS

| 6,737,800 | B1 | 5/2004 | Winters et al. | |
| 6,833,668 | B1 | 12/2004 | Yamada et al. | |
| 7,470,933 | B2 * | 12/2008 | Lee et al. | 257/79 |
| 8,053,975 | B2 * | 11/2011 | Chun et al. | 313/504 |

FOREIGN PATENT DOCUMENTS

| JP | 2000-173766 | 6/2000 |
| JP | 2001-71558 | 3/2001 |
| JP | 2002-244073 | 8/2002 |
| KR | 10-2004-0074958 | 8/2004 |

OTHER PUBLICATIONS

Korean Registration Determination Certificate dated Oct. 25, 2010, issued in corresponding Korean Patent Application No. 10-2009-0007384.

* cited by examiner

*Primary Examiner* — Minh-Loan T Tran
(74) *Attorney, Agent, or Firm* — Christie, Parker & Hale, LLP

(57) ABSTRACT

An organic light emitting display device (OLED) including: a substrate including a plurality of pixel units; first electrodes disposed in the pixel units; first subsidiary electrodes completely covering the top surfaces of corresponding ones of the first electrodes; first electrode protection units disposed on edges of the first electrodes on which the first subsidiary electrodes are not disposed; a pixel defining layer disposed on the substrate, having holes to expose the first electrodes; a light emission layer; and a second electrode disposed on the light emission layer. The light emission layer includes organic emission layers (EMLs) disposed on the first electrodes. The light emission layer may include subsidiary hole injection layers disposed on selected ones of the first electrodes, to vary a distance between the first electrodes and portions of the second electrode.

20 Claims, 4 Drawing Sheets

ORGANIC LIGHT EMITTING DISPLAY DEVICE

CROSS-REFERENCE TO RELATED APPLICATION

This application claims the benefit of Korean Patent Application No. 2009-7384, filed on Jan. 30, 2009, in the Korean Intellectual Property Office, the disclosure of which is incorporated herein, by reference.

BACKGROUND OF THE INVENTION

1. Field of the Invention

Aspects of the present invention relate to an organic light emitting display device (OLED).

2. Description of the Related Art

An organic light emitting display device (OLED) is a self-emissive display device, in which a voltage is applied to an organic thin layer including an anode, a cathode, and an organic emission layer (EML) interposed between the anode and the cathode, so that electrons and holes recombine in the organic EML, to emit light. In comparison with a cathode ray tube (CRT) or a liquid crystal display (LCD), an OLED may be lighter, thinner, have a wider viewing angle, a faster response speed, and lower power consumption.

A full-color OLED may exhibit different luminous efficiencies in different sub-pixels, that is, according to the colors of the emission materials therein. Typically, a green (G) emission material may have a higher luminous efficiency than a red (R) emission material or a blue (B) emission material. The R emission material may also have a higher luminous efficiency than the B emission material.

Thus, various conventional methods have been used in an attempt to produce OLEDs having a high luminous efficiency and luminance, by forming organic EMLs or organic thin layers, of respective sub-pixels to different thickness, so as to vary the optical thicknesses of the sub-pixels. However, the formation of the organic EMLs or organic thin layers, of the respective sub-pixels to different thicknesses involves a complicated process involving the use of a fine metal mask, which leads to an increase in failures, such as stains or dim spots, thus reducing yields.

SUMMARY OF THE INVENTION

Aspects of the present invention provide an organic light emitting display device (OLED) having a reduced failure rate and an improved optical efficiency.

According to an aspect of the present invention, there is provided an OLED including: a substrate including: a plurality of pixel units; first electrodes disposed in each of the pixel units, on the substrate; first subsidiary electrodes completely covering the top surfaces of selected ones of the first electrodes; first electrode protection units disposed on edges of the first electrodes on which the first subsidiary electrodes are not disposed; a pixel defining layer disposed on the substrate, having holes to expose the first electrodes; a light emission layer disposed on the pixel defining layer, including organic emission layers (EMLs) disposed on each of first electrodes; and a second electrode disposed on the light emission layer. The light emission layer may also include subsidiary layers disposed on selected ones of the first electrodes, to vary a distance between the first electrodes and corresponding portions of the second electrode.

According to aspects of the present invention, the light emission layer may include at least one layer selected from the group consisting of a hole injection layer (HIL), a hole transport layer (HTL), a hole blocking layer (HBL), an electron transport layer (ETL), and an electron injection layer (EIL).

According to aspects of the present invention, the subsidiary HILs may be formed of the same material as the layer selected from the group.

According to aspects of the present invention, the subsidiary layers may be formed adjacent to the layer selected from the group.

According to aspects of the present invention, the first subsidiary electrodes may be formed of at least one selected from the group consisting of indium tin oxide (ITO), aluminium zinc oxide (AZO), gallium zinc oxide (GZO), and indium zinc oxide (IZO).

According to aspects of the present invention, the first subsidiary electrodes and the first electrode protection units may be formed of the same material.

According to aspects of the present invention, the first electrode protection units may be completely covered by the pixel defining layer.

According to aspects of the present invention, the pixel units comprise red (R), green (G), and blue (B) pixel units.

According to aspects of the present invention, the first subsidiary electrodes may be disposed on the first electrodes in the R pixel units, the subsidiary layers may be disposed in the G pixel units, and the first subsidiary electrodes may be thicker than the subsidiary HILs.

According to aspects of the present invention, the subsidiary layers may be disposed in the R and G pixel units, and the subsidiary layers may be thicker than the first subsidiary electrodes.

According to aspects of the present invention, the first subsidiary electrodes, which have the same thickness, may be disposed in the R and G pixel units, and the subsidiary layers may be disposed in the R pixel units.

According to aspects of the present invention, the first electrodes may be reflective electrodes, and the second electrode may be a semitransparent electrode.

According to another aspect of the present invention, there is provided an OLED including: a substrate including a plurality of pixel units; first electrodes disposed in each of the pixel units, on the substrate; first subsidiary electrodes completely covering the top surfaces of selected ones of the first electrodes, second electrodes complete covering other selected ones of the first electrodes and having a different thickness than the first subsidiary electrodes; first electrode protection units is disposed on edges of the first electrodes, on which the first and second subsidiary electrodes are not formed; a pixel defining layer disposed on the substrate, having holes to expose the first electrodes; a light emission layer including organic EMLs disposed on each of the first electrodes; and a second electrode disposed on the light emission layer.

According to aspects of the present invention, the light emission layer may include at least one layer selected from the group consisting of an HIL, an HTL, an HBL, an ETL, and an EIL.

According to aspects of the present invention, the first and second subsidiary electrodes, and the first electrode protection units may be formed of the same material.

According to aspects of the present invention, the first electrode protection units may be completely covered by the pixel defining layer.

According to aspects of the present invention, the pixel units may include R, G, and B pixel units.

According to aspects of the present invention, the first and second subsidiary electrodes may be disposed on the first electrodes of the R and G pixel units, respectively, and the first subsidiary electrodes may be thicker than the second subsidiary electrodes.

According to aspects of the present invention, the first electrodes may be reflective electrodes, and the second electrode may be a semitransparent electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EXEMPLARY EMBODIMENTS

Figure 1:
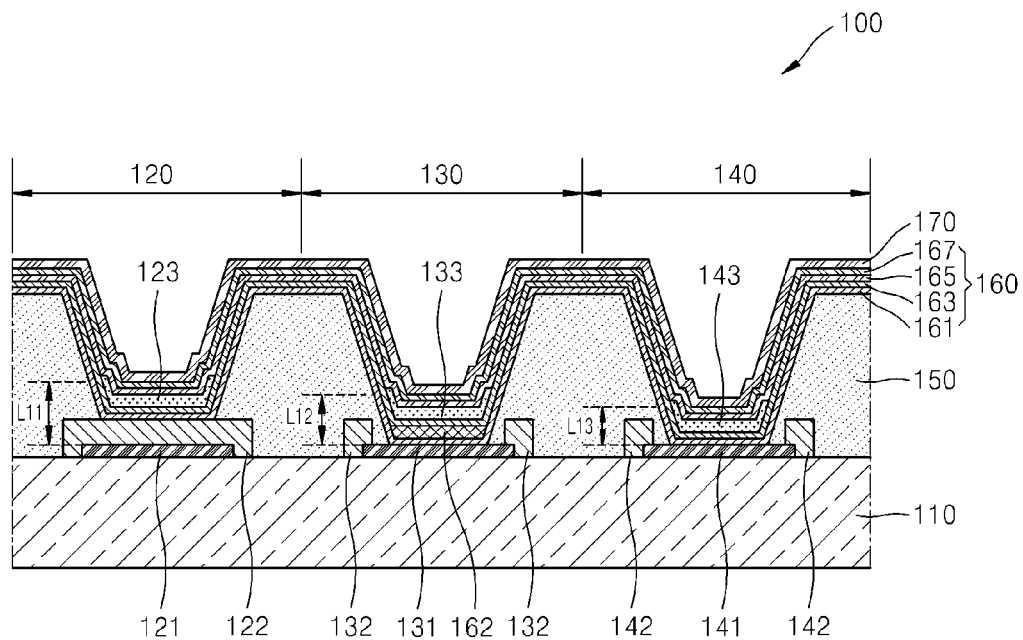
FIG. 1 is a cross-sectional view of a portion of an organic light emitting display device (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed on a second element, the first element can be disposed directly on the second element, or one or more other elements may be disposed therebetween. When a first element is referred to as being formed or disposed directly on a second element, no other elements are disposed therebetween.

FIG. 1 is a cross-sectional view of a portion of an organic light emitting display device (OLED) 100, according to an exemplary embodiment of the present invention, and FIGS. 2 through 6 are cross-sectional views illustrating a process of fabricating the OLED 100. Referring to FIG. 1, the OLED 100 may include first through third pixel units (sub-pixels) 120, 130, and 140 disposed on a substrate 110.

The substrate 110 may be a transparent glass material including $SiO_2$ as a main component. Of course, the substrate 110 may be formed of an opaque material, or of another material, such as plastic. A buffer layer (not shown) formed of $SiO_2$ and/or $SiN_X$ may be disposed on the substrate 110, to improve surface smoothness and prevent diffusion of impurities. In the case of an active-matrix OLED (AMOLED), a plurality of thin-film transistors (TFTs) (not shown) may be further provided on the substrate 110 and connected to the respective pixel units 120, 130, and 140.

For brevity, the first, second, and third pixel units 120, 130, and 140 are described as producing red (R), green (G), and blue (B) colors, respectively, but the present invention is not limited thereto. In other words, each of the pixel units 120, 130, and 140 may produce any one of R, G, and B colors, in any order. Also, a full-color OLED may be embodied by a color combination other than the combination of R, G, and B. Furthermore, a full-color OLED may be embodied by a combination of a different number of pixel units (e.g., a combination of four pixel units) rather than the shown combination of three pixel units.

First electrodes 121, 131, and 141 may be disposed in the first, second, and third pixel units 120, 130, and 140, respectively. The first electrodes 121, 131, and 141 may be reflective electrodes. The first electrodes 121, 131, and 141 may be formed of a reflective metal, such as silver (Ag), aluminum (Al), gold (Au), platinum (Pt), chrome (Cr), or an alloy thereof. Also, the first electrodes 121, 131, and 141 may be include two or three layers of indium tin oxide (ITO) or indium zinc oxide (IZO), on and/or under a reflective metal layer.

Figure 2:
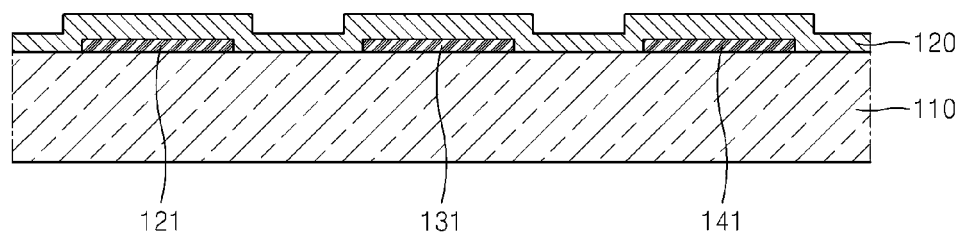
FIGS. 2 through 6 are cross-sectional views illustrating a process of fabricating the OLED shown in FIG. 1.

Referring to FIG. 2, a subsidiary electrode material 120 may be deposited on the first electrodes 121, 131, and 141. The subsidiary electrode material 120 may be formed of at least one selected from the group consisting of ITO, aluminum zinc oxide (AZO), gallium zinc oxide (GZO), and IZO. Although not shown, a photoresist (PR) may be coated on the subsidiary electrode material 120.

Figure 3:
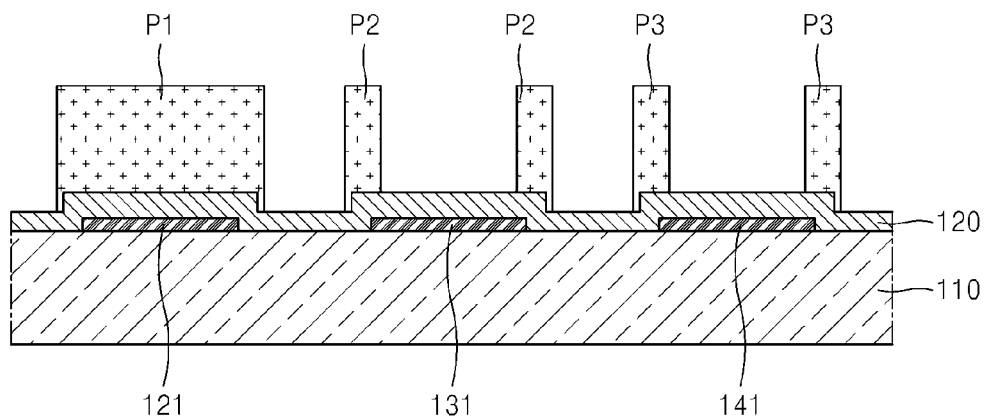

Referring to FIG. 3, the coated PR may be exposed and developed. A portion P1 of the coated PR, covering the first electrode 121 of the first pixel unit 120, and portions P2 and P3 of the coated PR, covering edges of the first electrodes 131 and 141 of the second and third pixel units 130 and 140, remain on the subsidiary electrode material 120, while the rest of the PR is removed. FIG. 3 illustrates a case where positive PR is used, but the present invention is not limited thereto, as a negative PR may be used instead.

Figure 4:
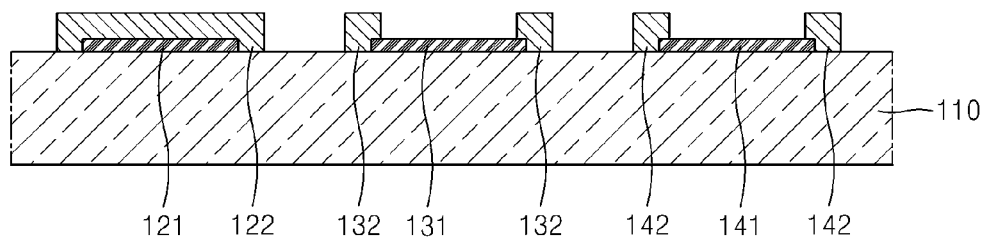

Referring to FIG. 4, the subsidiary electrode material 120 may be etched using the portions P1, P2, and P3 as a mask. As a result, a first subsidiary electrode 122 may be formed on the first electrode 121, and first electrode protection units 132 and 142 may be formed on edges of the first electrodes 131 and 141, of the second and third pixel units 130 and 140, respectively. The first electrode protection units 132 and 142 may prevent damage to the edges of the first electrodes 131 and 141, during the etching of the PR.

Figure 5:
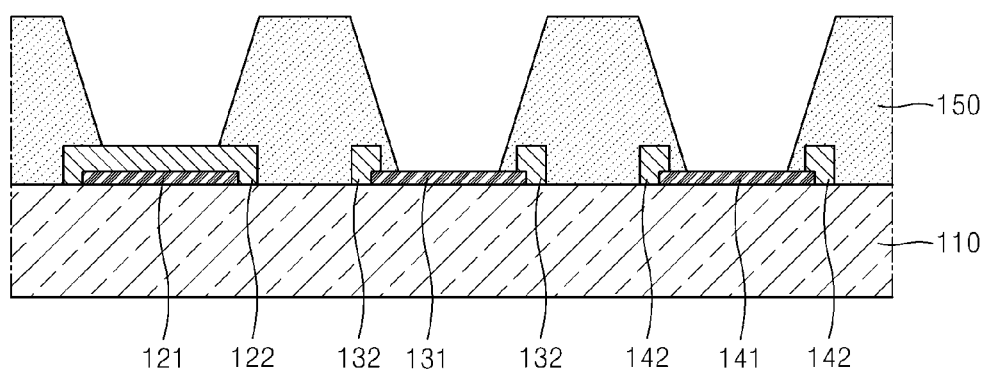

Referring to FIG. 5, a pixel defining layer 150 may be formed. The formation of the pixel defining layer 150 may include coating an organic insulating layer formed of, for example, an acryl resin, on the resultant structure of FIG. 4, to a predetermined thickness, and patterning the organic insulating layer to form emission regions. In the present exemplary embodiment, the pixel defining layer 150 may be patterned to expose the first subsidiary electrode 122 and the first electrodes 131 and 141. The pixel defining layer 150 may also be patterned to cover the edges of the first electrode 121 and the first subsidiary electrode 122, and also completely cover the first electrode protection units 132 and 142.

Figure 6:
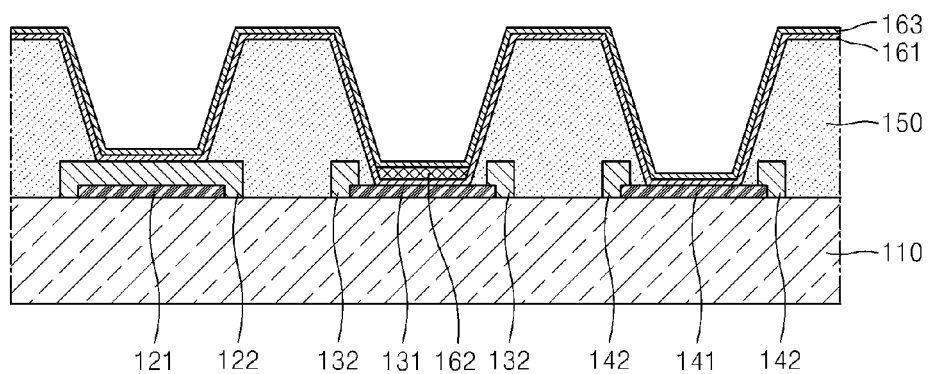

Referring to FIG. 6, a hole injection layer (HIL) 161, a subsidiary HIL 162, and a hole transport layer (HTL) 163 may be formed on the resultant structure of FIG. 5. The HIL 161 may be formed to cover all of the respective pixel units 120, 130, and 140. The HIL 161 may be formed of a conventional material, such as copper phthalocyanine (CuPc) or 4,4',4"-tris(N-(3-methylphenyl)-N-phenylamino)triphenylamine (MTDATA). In the present exemplary embodiment, since the first electrodes 121, 131, and 141 are used as anodes, the HIL 161 may be first formed as a common layer, on the first electrodes 121, 131, and 141. However, when the first electrodes 121, 131, and 141 are used as cathodes, an electron injection layer (EIL) may be first formed, instead of the HIL 161.

The subsidiary HIL 162 may be formed in the opening of the second pixel unit 130. The subsidiary HIL 162 may be thinner than the first subsidiary electrode 122. Thus, an optical distance L12 of the second pixel unit 130 may be less than an optical distance L11 of the first pixel unit 120, and may be greater than an optical distance L13 of the third pixel unit 140, thereby increasing the optical efficiency of the OLED 100. In the present embodiment, since a fine metal mask is used only once, during the formation of the subsidiary HIL 162, a failure rate, resulting from stains and dim spots associated with mask use, is reduced. The subsidiary HIL 162 may be formed of the same material as the HIL 161.

The HTL 163 may be formed to cover both the HIL 161 and the subsidiary HIL 162. The HTL 163 may be formed of a material, such as N,N'-Di(naphthalene-1-yl)-N,N'-diphenyl-benzidine (NPB) or poly(3,4-ethylenedioxythiophene) (PEDOT). The subsidiary HIL 162 may be formed of the same material as the HTL 163.

Referring to FIG. 1, organic emission layers (EMLs) 123, 133, and 143, capable of producing R, B, and G colors, respectively, may be respectively formed on the HTL 163, in the pixel units 120, 130, and 140. The (red) organic EML 123 may include carbazole biphenyl (CBP) or mCP, as a host, and may include, as a dopant, at least one phosphorescent material selected from the group consisting of bis(1-phenylisoquinoline)acetylacetonate iridium (PIQIr(acac)), bis(1-phenylquinoline)acetylacetonate iridium (PQIr(acac), tris(1-phenylquinoline) iridium (PQIr), and octaethylporphyrin platinum (PtPEP). Alternatively, the red organic EML 123 may be formed of a fluorescent material, such as PED:Eu (DBM)3(Phen) or perylene.

The (green) organic EML 133 may include CBP or mCP as a host and may include a phosphorescent material such as fac tris(2-phenylpyridine) iridium (Ir(ppy)3) as a dopant. Alternatively, the organic EML 133 may include a fluorescent material, such as tris(8-hydroxyquinoline) aluminum (Alq3).

The (blue) organic EML 143 may include a fluorescent material selected from the group consisting of DPVBi, spiro-DPVBi, spiro-6P, distilled benzene (DSB), distyryl arylene (DSA), PFO polymers, and PPV polymers. The organic EML 143 may be formed of a fluorescent material, so as to prevent its optical characteristics from becoming unstable, which may occur when it is formed of a phosphorescent material.

The organic EMLs 123, 133, and 143 may be formed using a conventional process, such as laser induced thermal imaging (LITI), inkjet printing, or vacuum evaporation. Although not shown, a hole blocking layer (HBL) may be formed of a conventional material, on the organic EMLs123, 133, and 143. For example, the HBL may be formed of bis(2-methy-8-quinolinato)-4-phenylphenolate aluminum (BAlq).

Referring to FIG. 1, an electron transport layer (ETL) 165 and an electron injection layer (EIL) 167 may be formed on the organic EMLs 123, 133, and 143. The ETL 165 may include a polycyclic hydrocarbon derivative, a heterocyclic compound, or tris(8-hydroxyquinolinato) aluminum (Alq3). The EIL 167 may be formed of LiF, Liq, NaF, or Naq. Collectively, the organic EMLs 123, 133, and 143; the HIL 161, the HTL 163, the ETL 165, the EIL 167, and the subsidiary HIL 162 may be referred to as a light emission layer 160, however the present invention is not limited thereto. In particular, various layers may be added to, or omitted from, the light emission layer 160.

A second electrode 170 (common electrode) may be formed on the light emission layer 160. The second electrode 170 may be formed of a semitransparent metal, which may be an alloy of magnesium (Mg) and silver (Ag), or one selected from the group consisting of Ag, aluminum (Al), gold (Au), platinum(Pt), chrome (Cr), and an alloy thereof. When formed of a semitransparent metal, the second electrode 170 may be formed to a thickness sufficient to obtain a reflection rate of about 5%, or higher, and a transmission rate of about 50%.

In an OLED according to the present exemplary embodiment, a subsidiary electrode with a predetermined thickness is formed on a first electrode, in a first pixel unit, and a subsidiary thin layer with a smaller thickness is formed in a second pixel unit, so that an optical distance of the second pixel unit can be less than that of the first pixel unit, and greater than that of a third pixel unit, thereby optimizing the optical efficiency of the OLED 100. Also, a protection unit is formed on an edge of first electrodes formed in each of the second and third pixel units, to prevent damage thereto. Furthermore, since a subsidiary thin layer is formed only once, a fine metal mask for controlling the optical distance is used only once, thereby reducing failure rates.

Figure 7:
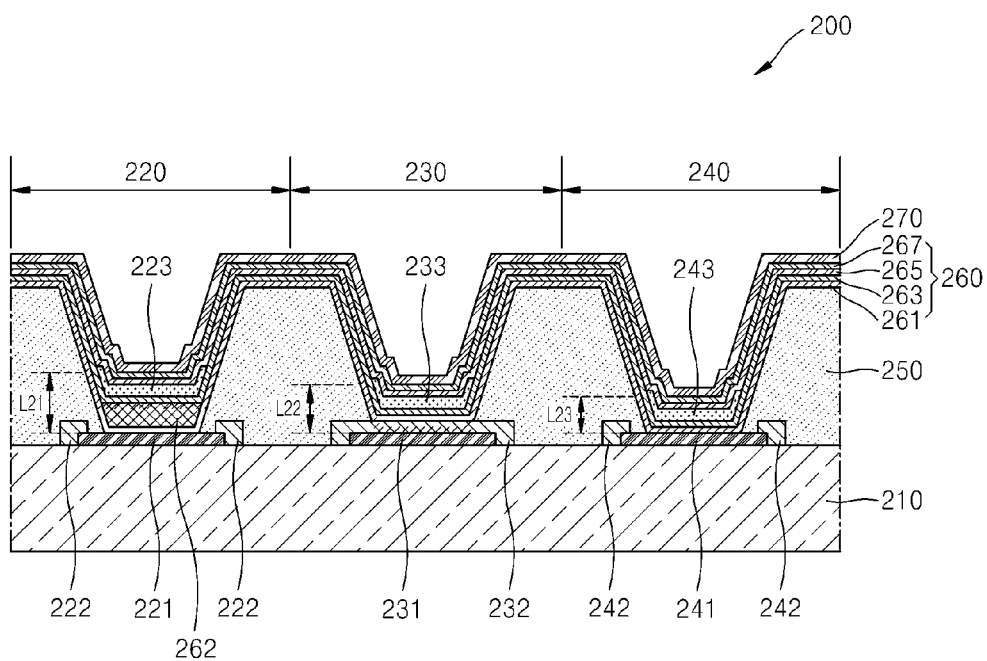
FIG. 7 is a cross-sectional view of a portion of an OLED, according to another exemplary embodiment of the present invention.

FIG. 7 is a cross-sectional view of an OLED 200, according to another exemplary embodiment of the present invention. Hereinafter, only the differences between the OLED 100 and the OLED 200 will be described in detail. Referring to FIG. 7, the OLED 200 may include first through third pixel units (sub-pixels) 220, 230, and 240 disposed on a substrate 210. Like in the previous embodiment, the first pixel unit 220 may produce an R color, the second pixel unit 230 may produce a G color, and the third pixel unit 240 may produce a B color.

First electrodes (reflective electrodes) 221, 231, and 241 may be formed in the pixel units 220, 230, and 240, respectively. A first subsidiary electrode 232 may be formed on the first electrode 231, while first electrode protection units 222 and 242 may be formed on edges of the first electrodes 221 and 241, respectively.

A pixel defining layer 250 may be patterned to expose the first subsidiary electrode 222 and the first electrodes 221 and 241. The pixel defining layer 250 may be patterned to cover edges of the first electrode 231 and the first subsidiary electrode 232, and also completely cover the first electrode protection units 222 and 242.

An HIL 261 and an HTL 263 may be formed on the pixel defining layer 250, the first electrodes 221 and 241, and the first subsidiary electrode 232. A subsidiary HIL 262 may be formed to a predetermined thickness, in the first pixel unit 220. The subsidiary HIL 262 may be thicker than the first subsidiary electrode 232. The subsidiary HIL 262 may be formed of the same material as the HIL 261. The HTL 263 may be formed to cover both the HIL 261 and the subsidiary HIL 262.

Organic EMLs 223, 233, and 243, capable of producing R, G, and B colors, may be formed on the HTL 263, in the pixel units 220, 230, and 240, respectively. An ETL 265 and an EIL 267 may be sequentially formed on the organic EMLs 223, 233, and 243. A second electrode 270 may be formed on the EIL 267, as a common electrode. The second electrode 270 may be formed of a semitransparent metal. Collectively, the organic EMLs 223, 233, and 243; the HIL 261, the HTL 263, the ETL 265, the EIL 267, and the subsidiary HIL 262 may be referred to as a light emission layer 260, however the present invention is not limited thereto. In particular, various layers may be added to, or omitted from, the light emission layer 260.

As a result, an optical distance L22 of the second pixel unit 230 may be less than an optical distance L21 of the first pixel unit 220, and may be greater than an optical distance L23 of the third pixel unit 240, thereby increasing the optical efficiency of the OLED 200. Also, in the present exemplary embodiment, since a fine metal mask is used only once, to form the subsidiary HIL 262, a failure rate, due to stains and dim spots, is reduced. In addition, the first electrode protection units 222 and 242, formed on the edges of the first electrodes 221 and 241, may prevent damage to the edges of the first electrodes 221 and 241, during the etching of a PR.

Figure 8:
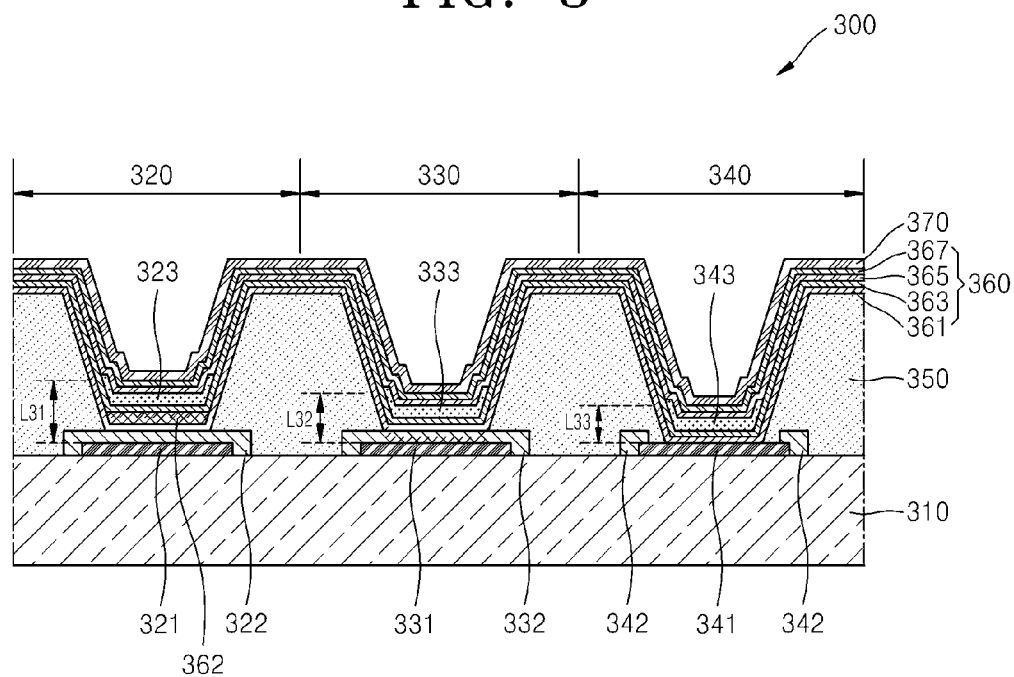
FIG. 8 is a cross-sectional view of a portion of an OLED, according to another exemplary embodiment of the present invention.

FIG. 8 is a cross-sectional view of an OLED 300, according to yet another exemplary embodiment of the present invention. Hereinafter differences between the OLED 100 and the OLED 300 will be described in detail. Referring to FIG. 8, the OLED 300 may include first through third pixel units (subpixels) 320, 330, and 340 disposed on a substrate 310. Like in the previous exemplary embodiments, the first pixel unit 320 may produce an R color, the second pixel unit 330 may produce a G color, and the third pixel unit 340 may produce a B color.

First electrodes 321, 331, and 341 (reflective electrodes) may be formed in the pixel units 320, 330, and 340, respectively. First subsidiary electrodes 322 and 332 may be formed on the first electrodes 321 and 331, respectively, while a first electrode protection unit 342 may be formed on edges of the first electrode 341. The first subsidiary electrode 322 may be as thick as the first subsidiary electrode 332.

A pixel defining layer 350 may be patterned to expose the first subsidiary electrodes 322 and 332, and the first electrode 341. The pixel defining layer 350 may be patterned to cover edges of the first subsidiary electrodes 322 and 332, and also completely cover the first electrode protection unit 342.

An HIL 361 and an HTL 363 may be formed on the pixel defining layer 350, the first electrode 341, and the first subsidiary electrode 322 and 332. The HIL 361 and the HTL 363 may be formed to cover all of the respective pixel units 320, 330, and 340.

A subsidiary HIL 362 may be formed to a predetermined thickness, in an opening of the first pixel unit 320. The subsidiary HIL 362 may be formed of the same material as the HIL 361.

The HTL 363 may be formed to cover both the HIL 361 and the subsidiary HIL 362. Organic EMLs 323, 333, and 343, capable of respectively forming R, G, and B colors, may be formed on the HTL 363, in the pixel units 320, 330, and 340, respectively.

An ETL 365 and an EIL 367 may be sequentially formed on the organic EMLs 323, 333, and 343. A second electrode 370 (common electrode) may be formed on the EIL 367. The second electrode 370 may be formed of a semitransparent metal. Collectively, the organic EMLs 323, 333, and 343; the HIL 361, the HTL 363, the ETL 365, the EIL 367, and the subsidiary HIL 362 may be referred to as a light emission layer 360, however the present invention is not limited thereto. In particular, various layers may be added to, or omitted from, the light emission layer 360.

An optical distance L32 of the second pixel unit 330 may be less than an optical distance L31 of the first pixel unit 320, and may be greater than an optical distance L33 of the third pixel unit 340, thereby increasing the optical efficiency of the OLED 300. Also, since a fine metal mask is used only once, to form the subsidiary HIL 362, a failure rate, due to stains and dim spots, is reduced. In addition, the first electrode protection unit 342 may prevent damage to the edges of the first electrode 341, during the etching of a PR.

Figure 9:
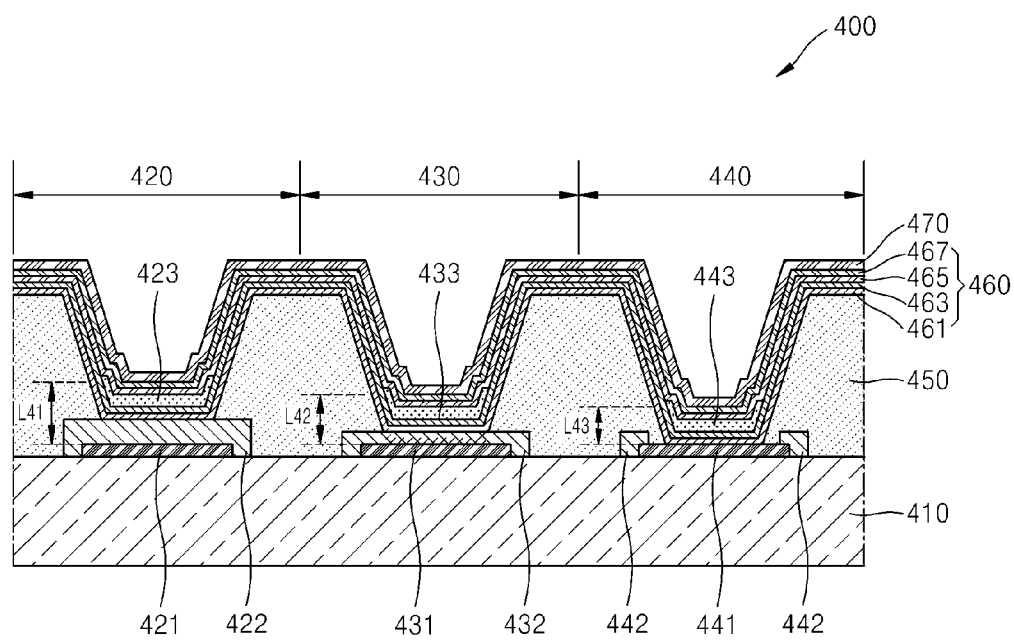
FIG. 9 is a cross-sectional view of a portion of an OLED, according to another exemplary embodiment of the present invention.

FIG. 9 is a cross-sectional view of an OLED 400, according to still another exemplary embodiment of the present invention. Hereinafter differences between the OLED 100 and the OLED 400 will be described in detail. Referring to FIG. 9, the OLED 400 may include first through third pixel units 420, 430, and 440 disposed on a substrate 410. Like in the previous exemplary embodiments, the first pixel unit 320 may produce an R color, the second pixel unit 330 may produce a G color, and the third pixel unit 340 may produce a B color.

First electrodes 421, 431, and 441 (reflective electrodes) may be formed in the pixel units 420, 430, and 440, respectively. First and second subsidiary electrodes 422 and 432 may be formed on the first electrodes 421 and 431, respectively, while a first electrode protection unit 442 may be formed on edges of the first electrode 441. The first subsidiary electrode 422 may be thicker than the second subsidiary electrode 432.

A pixel defining layer 450 may be patterned to expose the first and second subsidiary electrodes 422 and 432, and the first electrode 441. Also, the pixel defining layer 450 may be patterned to cover edges of the first electrodes 421 and 431, and the first and second subsidiary electrodes 422 and 432, and also completely cover the first electrode protection unit 442.

An HIL 461 and an HTL 463 may be formed on the pixel defining layer 450, the first electrode 441, and the first subsidiary and second electrodes 422 and 432. The HIL 461 and the HTL 463 may be formed to cover all of the pixel units 420, 430, and 440. The HTL 463 may be formed on the HIL 461.

Organic EMLs 423, 433, and 443, capable of producing R, G, and B colors, may be formed on the HTL 463, in the pixel units 420, 430, and 440, respectively. An ETL 465 and an EIL 467 may be sequentially formed as common layers, on the organic EMLs 423, 433, and 443. A second electrode 470 (common electrode) may be formed on the EIL 467. The second electrode 470 may be formed of a semitransparent metal.

Collectively, the organic EMLs 423, 433, and 443; the HIL 461, the HTL 463, the ETL 465, and the EIL 467, may be referred to as a light emission layer 460, however the present invention is not limited thereto. In particular, various layers may be added to, or omitted from, the light emission layer 460. The light emission layer 460 is different from the previous embodiments, in that it does not include a subsidiary HIL. As a result, an optical distance L42 of the second pixel unit 430 may be less than an optical distance L41 of the first pixel unit 420, and may be greater than an optical distance L43 of the third pixel unit 440, thereby increasing the optical efficiency of the OLED 400. Also, a fine metal mask for forming a subsidiary thin layer is not used, thereby reducing a failure rate due to stains and dim spots. In addition, the first electrode protection unit 442 may prevent damage to the edges of the first electrode 441, during the etching of a PR.

In the above-described exemplary embodiments and drawings, a subsidiary HIL is formed of the same material as an HIL, adjacent to the HIL, and is used as a subsidiary thin layer, but the present invention is not limited thereto. A layer formed of the same material as any one thin layer selected out of an HTL, an HBL, an ETL, and an EIL, adjacent to the selected thin layer, may replace the subsidiary HIL, irrespective of its name. Also, although not shown in the drawings, the above-described OLEDs may further include a sealing member bonded to the substrates.

According to an OLED of the present invention, an optical distance of each pixel unit is optimized to increase optical efficiency, and a protection unit is formed on edges of a first electrode, to protect etching damage to the edges of the first electrode. Also, the use of a fine metal mask is reduced, thereby decreasing failure rates.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light emitting display device (OLED) comprising:
   a substrate including a plurality of pixel units;
   first electrodes disposed in the pixel units, on the substrate;
   first subsidiary electrodes covering entire top surfaces of selected ones of the first electrodes;
   first electrode protection units disposed on edges of the first electrodes on which the first subsidiary electrodes are not disposed;
   a pixel defining layer disposed on the substrate, having holes to expose the first electrodes;
   a light emission layer comprising,
      organic emission layers (EMLs) disposed on the first electrodes, and
      subsidiary layers disposed on selected ones of the first electrodes; and
   a second electrode disposed on the light emission layer;
   wherein the subsidiary layers vary a distance between the corresponding first electrodes and corresponding portions of the second electrode.

2. The OLED of claim 1, wherein the light emission layer comprises a layer selected from the group consisting of a hole injection layer (HIL), a hole transport layer (HTL), a hole blocking layer (HBL), an electron transport layer (ETL), and an electron injection layer (EIL).

3. The OLED of claim 2, wherein the subsidiary layers are formed of the same material as the layer selected from the group.

4. The OLED of claim 3, wherein the subsidiary layers are disposed directly on the layer selected from the group.

5. The OLED of claim 1, wherein the first subsidiary electrodes are formed of at least one selected from the group consisting of indium tin oxide (ITO), aluminium zinc oxide (AZO), gallium zinc oxide (GZO), and indium zinc oxide (IZO).

6. The OLED of claim 1, wherein the first subsidiary electrodes and the first electrode protection units are formed of the same material.

7. The OLED of claim 1, wherein the first electrode protection units are disposed directly on the pixel defining layer.

8. The OLED of claim 1 wherein the pixel units comprise red (R), green (G), and blue (B) pixel units.

9. The OLED of claim 8, wherein the first subsidiary electrodes are disposed on the first electrodes of the R pixel units, the subsidiary layers are disposed in the G pixel units, and the first subsidiary electrodes are thicker than the subsidiary layers.

10. The OLED of claim 8, wherein:
    the subsidiary layers are disposed in the R pixel units;
    the first subsidiary electrodes are disposed in the G pixel units; and
    the subsidiary layers are thicker than the first subsidiary electrodes.

11. The OLED of claim 8, wherein:
    the first subsidiary electrodes have the same thickness and are disposed in the R and G pixel units; and
    the subsidiary layers are disposed in the R pixel units.

12. The OLED of claim 1, wherein:
    the first electrodes are reflective electrodes; and
    the second electrode is a semitransparent electrode.

13. The OLED of claim 1, wherein the subsidiary layers comprise a hole injection layer (HIL).

14. An organic light emitting display device (OLED) comprising:
    a substrate comprising a plurality of pixel units;
    first electrodes disposed in the pixel units, on the substrate;
    first subsidiary electrodes completely covering top surfaces of corresponding ones of the first electrodes;
    second subsidiary electrodes completely covering top surfaces of corresponding ones of the first electrodes;
    first electrode protection units disposed on edges of the first electrodes that are not covered by the first or second subsidiary electrodes;
    a pixel defining layer disposed on the substrate, having holes to expose the first electrodes;
    a light emission layer comprising organic emission layers (EMLs) disposed on the first electrodes; and
    a second electrode disposed on the light emission layer.

15. The OLED of claim 14, wherein the light emission layer includes at least one layer selected from the group consisting of a hole injection layer (HIL), a hole transport layer (HTL), a hole blocking layer (HBL), an electron transport layer (ETL), and an electron injection layer (EIL).

16. The OLED of claim 14, wherein the first subsidiary electrodes and the first electrode protection units are formed of the same material.

17. The OLED of claim 14, wherein the first electrode protection units are disposed directly on the pixel defining layer.

18. The OLED of claim 14, wherein the pixel units comprise red (R), green (G), and blue (B) pixel units.

19. The OLED of claim 18, wherein:
    the first subsidiary electrodes are disposed on the first electrodes corresponding to the R and G pixel units; and
    the first subsidiary electrodes corresponding to the R pixel units are thicker than the first subsidiary electrodes corresponding to the G pixel units.

20. The OLED of claim 14, wherein:
    the first electrodes are reflective electrodes; and
    the second electrode is a semitransparent electrode.

* * * * *